United States Patent
Satoh

(10) Patent No.: US 11,303,290 B2
(45) Date of Patent: Apr. 12, 2022

(54) SEMICONDUCTOR INTEGRATED CIRCUIT AND RECEIVER

(71) Applicant: Kioxia Corporation, Tokyo (JP)

(72) Inventor: Yuji Satoh, Kawasaki Kanagawa (JP)

(73) Assignee: KIOXIA CORPORATION, Tokyo (JP)

(*) Notice: Subject to any disclaimer, the term of this patent is extended or adjusted under 35 U.S.C. 154(b) by 0 days.

(21) Appl. No.: 17/004,224

(22) Filed: Aug. 27, 2020

(65) Prior Publication Data

US 2021/0297086 A1    Sep. 23, 2021

(30) Foreign Application Priority Data

Mar. 19, 2020 (JP) .............................. JP2020-048593

(51) Int. Cl.
- *H03M 1/06* (2006.01)
- *H03M 1/46* (2006.01)
- *H03M 1/12* (2006.01)
- *H03M 1/10* (2006.01)

(52) U.S. Cl.
CPC ....... *H03M 1/0607* (2013.01); *H03M 1/1057* (2013.01); *H03M 1/1245* (2013.01); *H03M 1/468* (2013.01)

(58) Field of Classification Search
CPC ............ H03M 1/0607; H03M 1/1019; H03M 1/1245; H03M 1/468; H03M 1/365; H03M 1/12; H03M 1/123; H03M 1/1295; H03M 1/56; H03M 3/34; H03M 1/1225; H03M 1/185; H03M 1/187; H03M 1/208; H03M 1/363; H03M 3/43; H03M 1/0682; H03M 1/165; H03M 1/46; H03M 1/52; H03M 2201/192; H03M 1/00

USPC .................. 341/118–121, 139, 140, 142
See application file for complete search history.

(56) References Cited

U.S. PATENT DOCUMENTS

| | | | | |
|---|---|---|---|---|
| 7,129,875 B1* | 10/2006 | Altun | ............... | H03M 3/322 |
| | | | | 341/143 |
| 7,405,691 B2* | 7/2008 | Makigawa | .......... | H03M 1/0646 |
| | | | | 341/159 |
| 7,928,885 B2* | 4/2011 | Sugimoto | ............. | H03M 1/002 |
| | | | | 341/155 |
| 9,425,811 B1 | 8/2016 | Mandal | | |
| 9,866,232 B2* | 1/2018 | Furuta | ..................... | H03M 1/46 |

(Continued)

FOREIGN PATENT DOCUMENTS

JP    2009-231954 A    10/2009

*Primary Examiner* — Linh V Nguyen
(74) *Attorney, Agent, or Firm* — Foley & Lardner LLP

(57) ABSTRACT

In a semiconductor integrated circuit, a first generation circuit generates a common mode voltage of a differential signal. A second generation circuit generates temperature information according to the common mode voltage. The temperature information is information corresponding to a characteristic of an amplifier circuit related to an ambient temperature. A correction circuit corrects a first reference voltage and a second reference voltage according to the temperature information. A comparator includes a first input node to which a first signal line is electrically connected; a second input node to which a second signal line is electrically connected; a third input node to which the corrected first reference voltage is input; and a fourth input node to which the corrected second reference voltage is input.

16 Claims, 9 Drawing Sheets

(56) References Cited

U.S. PATENT DOCUMENTS

| | | | |
|---|---|---|---|
| 2007/0280330 A1* | 12/2007 | Jeong | G01K 7/01 |
| | | | 374/141 |
| 2008/0122546 A1* | 5/2008 | Shiramizu | H03L 7/0995 |
| | | | 331/34 |
| 2009/0238301 A1 | 9/2009 | Cheung | |
| 2009/0243575 A1* | 10/2009 | Akiyama | H02M 3/156 |
| | | | 323/282 |
| 2009/0290073 A1* | 11/2009 | Sagawa | G09G 3/3611 |
| | | | 348/744 |
| 2013/0120178 A1* | 5/2013 | Murakami | G01D 5/00 |
| | | | 341/155 |
| 2015/0041317 A1* | 2/2015 | Chan | G01N 27/3275 |
| | | | 204/406 |
| 2015/0171885 A1* | 6/2015 | Juang | H03F 3/45183 |
| | | | 341/118 |
| 2017/0163265 A1* | 6/2017 | Kano | H03L 1/026 |

* cited by examiner

FIG. 6

| | Reference potential generator criteria (depend on power supply) | | Observation target criteria (depend on temperature and power supply) | |
|---|---|---|---|---|
| | 322 → $(1-\beta)R_S$, $\beta R_S$, $V_{RESDAC}$, $0<\beta<1$ | 321 → $I_D$, $R_D$, $V_{DAC}$ | 4f → $R_C$, $I_C$, $V_{com}$, $R_C I_C = KT$ | 324 → $(1-\alpha)R_S$, $\alpha R_S$, $V_{REScom}$, $0<\alpha<1$ |
| Analog Voltage | $V_{RESDAC}=\beta V_{DD}$ VOLTAGE DEPENDENCE EXISTS | $V_{DAC}=R_D I_D$ VOLTAGE DEPENDENCE DOES NOT EXIST | $V_{com}=V_{DD}-KT$ VOLTAGE AND TEMPERATURE DEPENDENCE EXISTS | $V_{REScom}=\alpha V_{DD}$ VOLTAGE DEPENDENCE EXISTS |
| Digital code (however, converted by mapping $2^n / V_{DD}$) quantization with n bits | $C_{RESDAC}=\beta 2^n$ VOLTAGE DEPENDENCE DOES NOT EXIST | $C_{DAC}=\dfrac{2^n}{V_{DD}}R_D I_D$ VOLTAGE DEPENDENCE EXISTS | $C_{com}=\left(1-\dfrac{KT}{V_{DD}}\right)2^n$ VOLTAGE AND TEMPERATURE DEPENDENCE EXISTS | $C_{REScom}=\alpha 2^n$ VOLTAGE DEPENDENCE DOES NOT EXIST |

SEMICONDUCTOR INTEGRATED CIRCUIT AND RECEIVER

CROSS-REFERENCE TO RELATED APPLICATION

This application is based upon and claims the benefit of priority from Japanese Patent Application No. 2020-048593, filed Mar. 19, 2020, the entire contents of which are incorporated herein by reference.

FIELD

Embodiments described herein relate generally to a semiconductor integrated circuit and a receiver.

BACKGROUND

In a semiconductor integrated circuit, a signal is received and data are restored from the signal. At this time, it is desired to appropriately restore the data.

DESCRIPTION OF THE DRAWINGS

FIG. 6 is a diagram illustrating an output of each circuit according to at least one embodiment.

DETAILED DESCRIPTION

At least one embodiment provides a semiconductor integrated circuit and a receiver suitable for appropriately restoring data.

In general, according to at least one embodiment, provided is a semiconductor integrated circuit including an amplifier circuit, a first generation circuit, a second generation circuit, a correction circuit, and a comparator. The amplifier circuit includes a first output node that outputs a first signal in a differential signal; and a second output node that outputs a second signal in the differential signal. The first generation circuit includes a first end and a second end. The first end is connected to the first output node of the amplifier circuit via a first signal line. The second end is connected to the second output node of the amplifier circuit via a second signal line. The second signal line forms a differential pair with the first signal line. The first generation circuit is configured to generate a common mode voltage of the differential signal. The second generation circuit is configured to generate temperature information according to the common mode voltage. The temperature information is information corresponding to a characteristic of the amplifier circuit related to an ambient temperature. The correction circuit is configured to correct a first reference voltage and a second reference voltage according to the temperature information. The comparator includes a first input node to which the first signal line is electrically connected; a second input node to which the second signal line is electrically connected; a third input node to which the corrected first reference voltage is input; and a fourth input node to which the corrected second reference voltage is input.

Hereinafter, a semiconductor integrated circuit according to at least one embodiment will be described in detail with reference to the accompanying drawings. The present disclosure is not limited to the embodiment.

Embodiment

Figure 1:
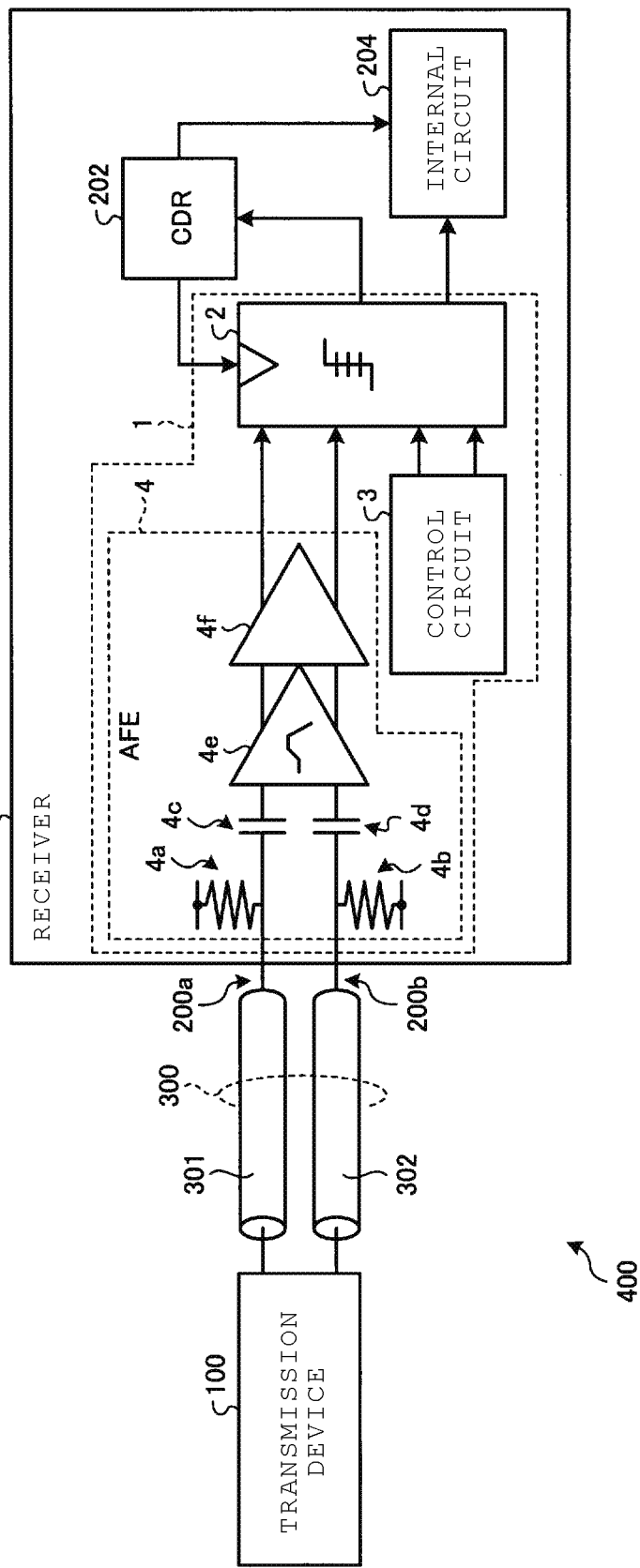
FIG. 1 is a diagram illustrating a configuration of a communication system to which a semiconductor integrated circuit according to at least one embodiment is applied.

For example, a semiconductor integrated circuit according to at least one embodiment is used in a communication system that performs wired communication. For example, a communication system 400 to which a semiconductor integrated circuit 1 is applied is configured as illustrated in FIG. 1. FIG. 1 is a diagram illustrating a configuration of the communication system 400 to which the semiconductor integrated circuit 1 is applied. The wired communication may be used in a memory interface for controlling a semiconductor memory.

The communication system 400 includes a transmission device 100, a receiver 200, and a wired communication path 300. The transmission device 100 and the receiver 200 are communicably connected to each other via the wired communication path 300. The transmission device 100 transmits particular data to the receiver 200 via the wired communication path 300. The wired communication path 300 is differentially configured and has a communication path on the P side 301 and a communication path on the N side 302. The receiver 200 receives the particular data from the transmission device 100 via the wired communication path 300. The receiver 200 includes receiving nodes 200a and 200b, the semiconductor integrated circuit 1, a clock data recovery (CDR) circuit 202, and an internal circuit 204. The wired communication path 300 can be connected to the receiving nodes 200a and 200b. The semiconductor integrated circuit 1 may be disposed on the output side of the receiving nodes 200a and 200b.

The semiconductor integrated circuit 1 includes an analog front end (AFE) 4, a sampler 2, and a control circuit 3.

The AFE 4 includes pull-up resistors 4a and 4b, coupling capacitors 4c and 4d, an equalization circuit 4e, and an amplifier circuit 4f. The equalization circuit 4e may be implemented as a continuous time linear equalizer (CTLE) circuit. For example, the equalization circuit 4e may perform signal equalization with a gain characteristic corresponding to an inverse characteristic of an attenuation characteristic of the wired communication path 300. The amplifier circuit 4f can be implemented as a programmable gain amp (PGA) configured with an analog circuit. The amplifier circuit 4f amplifies the signal equalized by the equalization circuit 4e and transmits the amplified signal to the side of the sampler 2.

The sampler 2 receives a differential signal from the amplifier circuit 4f, and receives a differential reference voltage from the control circuit 3. The sampler 2 may include a plurality of comparators, uses the plurality of comparators to identify a value of data corresponding to the received signal based on the reference voltage, and supplies an identification result of the value of the data to the CDR 202 and the internal circuit 204.

A modulation method primarily used in the wired communication is amplitude modulation, and a binary amplitude modulation method (PAM2) such as NRZ may be adopted. In the NRZ, a transmission rate can be increased in a direction of increasing a band, but another method may be considered as a communication method due to the restriction of the communication path. As one of the methods, a multi-value amplitude modulation method of modulating multi-value data in an amplitude direction is described. For example, when the communication method is a four-value amplitude modulation method (PAM4), the data modulated in the amplitude direction may be identified by a plurality of threshold voltage determinations.

Figure 7A:
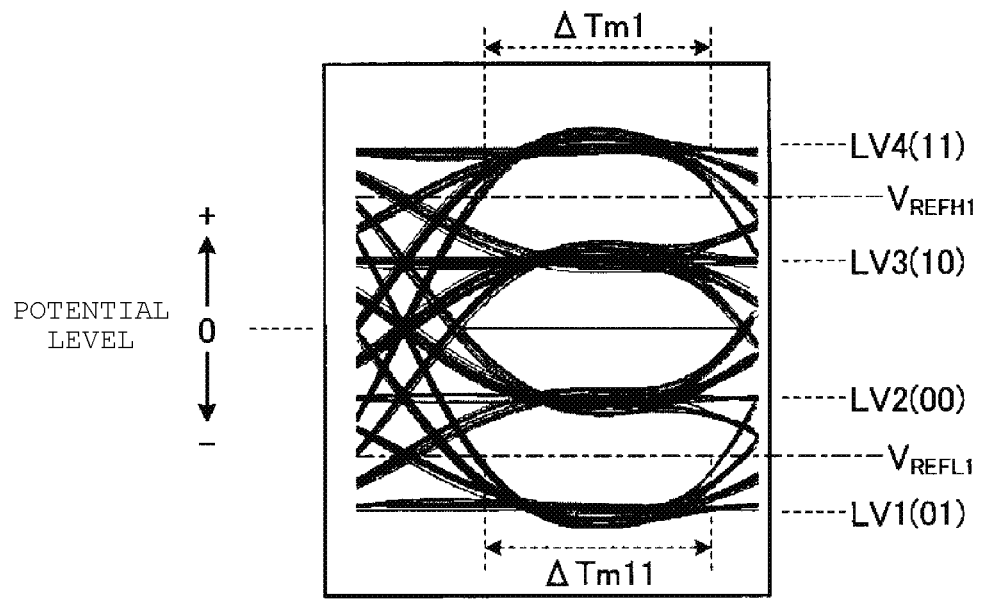
FIGS. 7A and 7B are diagrams illustrating a time margin of data value determination according to at least one embodiment.

For example, in the case of the PAM4, a modulated signal obtains any of four signal levels LV1 to LV4 (refer to FIG. 7A). For example, the signal level (a first signal level) LV1 represents a bit pattern "01". The signal level (a third signal level) LV2 represents a bit pattern "00". The signal level (a fourth signal level) LV3 represents a bit pattern "10". The signal level (a second signal level) LV4 represents a bit pattern "11".

An output amplitude of the amplifier circuit 4f has a large temperature characteristic, for example, has a characteristic that the output amplitude attenuates as a temperature increases. At this time, in the communication system 400 that performs the wired communication, an ambient temperature may change during a sequential operation in which commands and data continue. The semiconductor integrated circuit 1 may be required to keep communication quality constant even though the ambient temperature changes. Even though the output amplitude of the amplifier circuit 4f has the large temperature characteristic, however, it is difficult to calibrate the reference voltage of the sampler 2 during the sequential operation. The output of the amplifier circuit 4f has not only the temperature characteristic but also a power supply voltage characteristic. That is, the output amplitude may vary according to the variation of a power supply voltage value supplied to the amplifier circuit 4f. The power supply voltage value may vary during the sequential operation. For example, in the case of the PAM4, three threshold voltages determine which of the four data values becomes a signal amplitude that is influenced by the variation of the power supply voltage value. Among the three threshold voltages, a threshold voltage on the high amplitude side and a threshold voltage on the low amplitude side may easily deviate from an appropriate value (for example, an optimum value) due to the influence of the change in the ambient temperature. When the threshold voltage on the high amplitude side and the threshold voltage on the low amplitude side deviate from the appropriate values, it becomes difficult to secure a time margin in the determination of the data value. As a result, erroneous determination of the data value easily increases, and a bit error rate may deteriorate. Therefore, in the semiconductor integrated circuit 1, while the sequential operation is continued, it is desired to adjust a threshold voltage of the sampler 2 with respect to a signal that may be subject to the variation of the power supply voltage value so as to dynamically decrease the influence caused by the temperature change and the power supply voltage variation.

Here, the semiconductor integrated circuit 1 according to at least one embodiment enables the threshold voltage for determining the data value of the differential signal to dynamically compensate for the influence caused by the temperature characteristic and the power supply voltage characteristic by performing correction by using a circuit whose output is almost constant with respect to the power supply voltage, a circuit whose output changes with respect to the power supply voltage, and a circuit whose output is almost constant with respect to the temperature. Accordingly, it is possible not only to identify a value of a data signal by using an appropriate reference voltage in accordance with the temperature characteristic and the power supply voltage characteristic while the sequential operation is continued, but also to appropriately restore the data.

Figure 2:
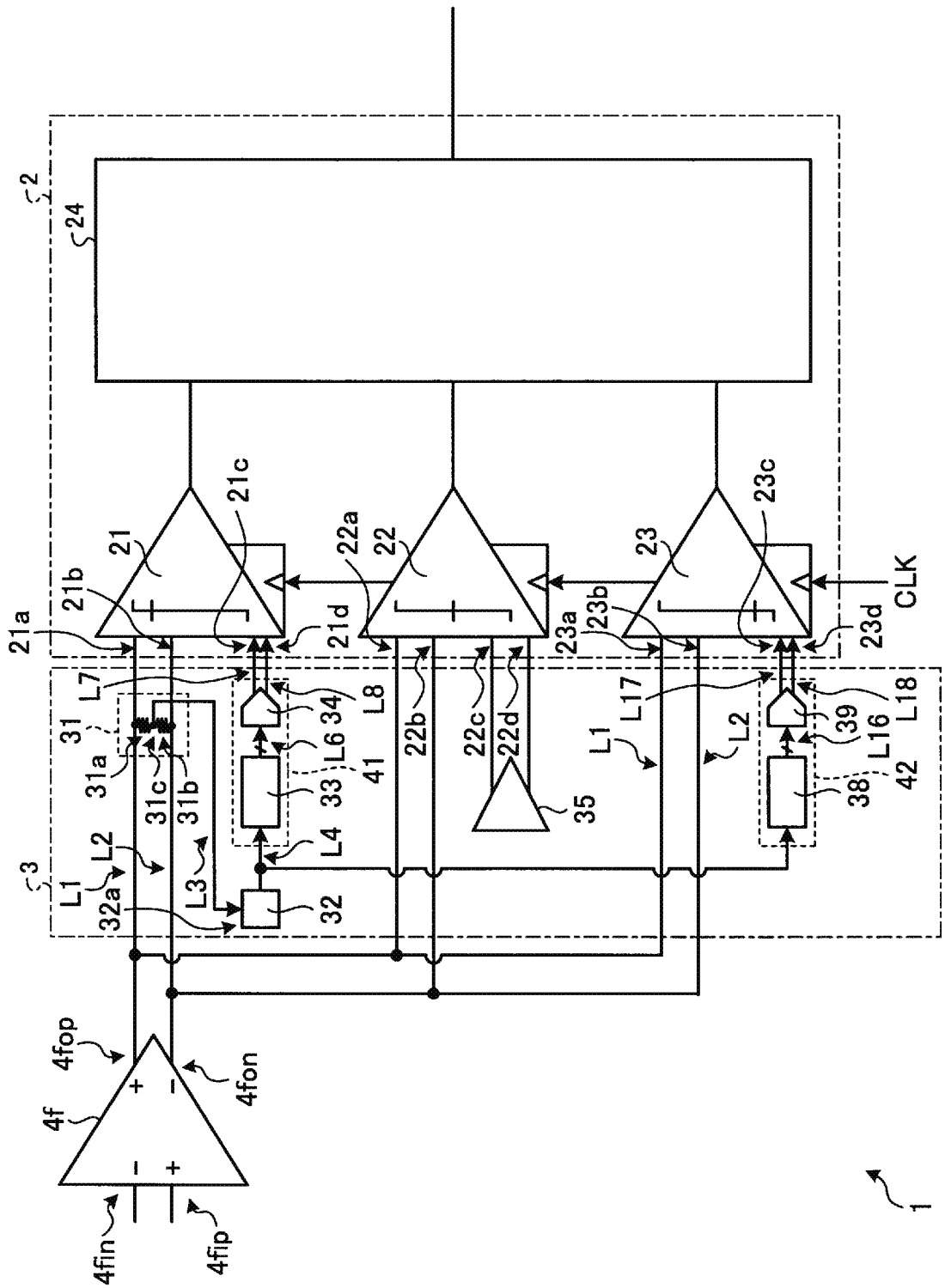
FIG. 2 is a circuit diagram illustrating an arrangement of the semiconductor integrated circuit according to at least one embodiment.

More specifically, the semiconductor integrated circuit 1 may be arranged as illustrated in FIG. 2. FIG. 2 is a circuit diagram illustrating an arrangement of the semiconductor integrated circuit 1. In FIG. 2, as the arrangement of the semiconductor integrated circuit 1, a configuration of equalizing a signal in accordance with the four-value amplitude modulation method (PAM4) is illustrated. The differential signal outputted from the amplifier circuit 4f of the AFE4 is sampled by the sampler 2 in order to identify the data value. The data value is identified by using the threshold voltage on the high amplitude side, a central threshold voltage, and the threshold voltage on the low amplitude side supplied from the control circuit 3. The sampling result is supplied to the CDR 202 and the internal circuit 204 as the identification result of the data value.

The sampler 2 includes a comparator 21, a comparator 22, a comparator 23, and a calculation circuit 24. The threshold voltage on the high amplitude side is supplied from the control circuit 3 to the comparator 21, and the comparator 21 determines the data value by using the threshold voltage on the high amplitude side. The central threshold voltage is supplied from the control circuit 3 to the comparator 22, and the comparator 22 determines the data value by using the central threshold voltage. The threshold voltage on the low amplitude side is supplied from the control circuit 3 to the comparator 23, and the comparator 23 determines the data value by using the threshold voltage on the low amplitude side. The calculation circuit 24 restores the data value by using the determination results of the comparator 21, the comparator 22, and the comparator 23. For example, in a case of (a determination value of the comparator 21, a determination value of the comparator 22, and a determination value of the comparator 23)=(H, H, H) with respect to the data signal on the P side of the differential signal, the calculation circuit 24 restores the data value to "11" corresponding to the LV4. In the case of (the determination value of the comparator 21, the determination value of the comparator 22, and the determination value of the comparator 23)=(L, H, H) with respect to the data signal on the P side, the calculation circuit 24 restores the data value to "10" corresponding to the LV3.

The control circuit 3 includes a generation circuit (a first generation circuit) 31, a generation circuit (a second generation circuit) 32, a correction circuit 41, a DA converter 35, and a correction circuit 42.

The amplifier circuit 4f includes an input node 4fip, an input node 4fin, an output node 4fop, and an output node 4fon. The input node 4fip and the input node 4fin form a differential pair, the input node 4fip is an input node on the P side of the differential signal, and the input node 4fin is an input node on the N side of the differential signal. The output node 4fop and the output node 4fon form a differential pair.

The output node 4*fop* is an output node on the P side of the differential signal. The output node 4*fon* is an output node on the N side thereof.

A signal line L1 and A signal line L2 are electrically connected between the amplifier circuit 4*f* and the comparator 21. The signal line L1 and the signal line L2 form a differential pair. The signal line L1 and the signal line L2 respectively transmit a differential signal on the P side and a differential signal on the N side. The signal line L1 is connected between the output node 4*fop* of the amplifier circuit 4*f* and an input node 21*a* of the comparator 21. The signal line L2 is connected between the output node 4*fon* of the amplifier circuit 4*f* and an input node 21*b* of the comparator 21. A path from the generation circuit 31 to the comparator 21 via the generation circuit 32 and the correction circuit 41 is a path branched from a path of signal transmission from the amplifier circuit 4*f* to the comparator 21 (that is, the signal line L1 and the signal line L2). The path from the generation circuit 31 to the comparator 21 via the generation circuit 32 and the correction circuit 41 is a path for correcting a threshold voltage on the high voltage side in accordance with a control value generated by the control circuit 3 and supplied to the generation circuit 32 and for supplying the corrected threshold voltage to the comparator 21.

The generation circuit 31 is disposed between the amplifier circuit 4*f* and the comparator 21. A first end of the generation circuit 31 is electrically connected to the output node 4*fop* on the P side of the amplifier circuit 4*f* via the signal line L1. A second end thereof is electrically connected to the output node 4*fon* on the N side of the amplifier circuit 4*f* via the signal line L2. The generation circuit 31 receives the differential signal on the P side and the differential signal on the N side via the signal line L1 and the signal line L2, and generates a common mode voltage from the signal on the P side and the signal on the N side.

The generation circuit 31 includes a resistance element 31*a*, a resistance element 31*b*, and a common mode node 31*c*. A first end of the resistance element 31*a* is electrically connected to the signal line L1. A second end thereof is electrically connected to the common mode node 31*c*. A first end of the resistance element 31*b* is electrically connected to the signal line L2. A second end thereof is electrically connected to the common mode node 31*c*. A resistance value of the resistance element 31*a* and a resistance value of the resistance element 31*b* are approximately equal to each other. Accordingly, when the differential signals are transmitted through the signal lines L1 and L2, the common mode voltage appears in the common mode node 31*c*.

The generation circuit 32 is disposed between the generation circuit 31, the correction circuit 41, and the correction circuit 42. The generation circuit 32 includes a control node connected to the generation circuit 31 via a signal line L3; and an output node connected to the correction circuit 41 and the correction circuit 42 via a signal line L4. The generation circuit 32 receives the common mode voltage via the signal line L3. The generation circuit 32 generates voltage information indicating the power supply voltage characteristic of the amplifier circuit 4*f*. The generation circuit 32 generates temperature information indicating the temperature characteristic of the amplifier circuit 4*f* according to the common mode voltage and the voltage information. The generation circuit 32 supplies the temperature information to the correction circuit 41 and the correction circuit 42 via the signal line L4.

Details of the internal configuration, the voltage information, and the temperature information of the generation circuit 32 will be described later.

The correction circuit 41 is disposed between the generation circuit 32 and the comparator 21. The correction circuit 41 corrects a value of a reference voltage from a predetermined value according to the temperature information, and supplies the corrected reference voltage to the comparator 21. The correction circuit 41 includes a correction value generation circuit 33 and a DA converter 34.

The correction value generation circuit 33 is disposed between the generation circuit 32 and the DA converter 34. The correction value generation circuit 33 includes an input node connected to the generation circuit 32 via the signal line L4; and an output node connected to the DA converter 34 via a signal line L6. The correction value generation circuit 33 receives the temperature information from the generation circuit 32 via the signal line L4. The correction value generation circuit obtains a correction value for compensating for a temperature change in the signal amplitude according to the temperature information. The correction value generation circuit 33 supplies the correction value to the DA converter 34 via the signal line L6.

The DA converter 34 is disposed between the correction value generation circuit 33 and the comparator 21. The DA converter 34 is connected to the correction value generation circuit 33 via the signal line L6, and is connected to the comparator 21 via signal lines L7 and L8. The DA converter 34 receives the control value indicating the reference voltage from the control circuit 3. The DA converter 35 respectively generates a reference voltage on the P side and a reference voltage on the N side according to the control value. The DA converter 34 receives the correction value of a digital value from the correction value generation circuit 33, and DA-converts the correction value to obtain a correction amount of an analog value. The DA converter 34 corrects the reference voltage on the P side (a first reference voltage) according to the correction amount of the analog value. The DA converter 34 supplies the corrected reference voltage to a reference node 21*c* of the comparator 21 via the signal line L7. The DA converter 34 corrects the reference voltage on the N side (a second reference voltage) according to the correction amount of the analog value, and supplies the corrected reference voltage to a reference node 21*d* of the comparator 21 via the signal line L8.

The signal line L1 and the signal line L2 are electrically connected between the amplifier circuit 4*f* and the comparator 22. The signal line L1 is connected between the output node 4*fop* of the amplifier circuit 4*f* and an input node 22*a* of the comparator 22, and the signal line L2 is connected between the output node 4*fon* of the amplifier circuit 4*f* and an input node 22*b* of the comparator 22. The DA converter 35 receives the control value indicating the reference voltage from the control circuit 3. According to the control value, the DA converter 35 generates the reference voltage on the P side and supplies the generated reference voltage on the P side to a reference node 22*c* of the comparator 22. The DA converter 35 generates the reference voltage on the N side and supplies the generated reference voltage on the N side to a reference node 22*d* of the comparator 22.

The signal line L1 and the signal line L2 are electrically connected between the amplifier circuit 4*f* and the comparator 23. The signal line L1 is connected between the output node 4*fop* of the amplifier circuit 4*f* and an input node 23*a* of the comparator 23. The signal line L2 is connected between the output node 4*fon* of the amplifier circuit 4*f* and an input node 23*b* of the comparator 23. A path from the generation circuit 31 to the comparator 23 via the generation circuit 32 and the correction circuit 42 is a path branched from a path of signal transmission from the amplifier circuit 4f to the comparator 23 (that is, the signal line L1 and the signal line L2). The path from the generation circuit 31 to the comparator 23 via the generation circuit 32 and the correction circuit 42 is a path for correcting a threshold voltage on the low voltage side in accordance with the control value generated by the control circuit 3 and supplied to the generation circuit 32 and for supplying the corrected threshold voltage to the comparator 23.

The correction circuit 42 is disposed between the generation circuit 32 and the comparator 23. The correction circuit 42 corrects a value of a reference voltage from a predetermined value according to the temperature information, and supplies the corrected reference voltage to the comparator 23. The correction circuit 42 includes a correction value generation circuit 38 and a DA converter 39.

The correction value generation circuit 38 is disposed between the generation circuit 32 and the DA converter 39. A first input node of the correction value generation circuit 38 is connected to the generation circuit 32 via the signal line L4, and an output node thereof is connected to the DA converter 39 via a signal line L16. The correction value generation circuit 38 receives the temperature information from the generation circuit 32 via the signal line L4. The correction value generation circuit 38 obtains a correction value for compensating for a temperature change in the signal amplitude according to the temperature information. The correction value generation circuit 38 supplies the correction value to the DA converter 39 via the signal line L16.

The DA converter 39 is disposed between the correction value generation circuit 38 and the comparator 23. The DA converter 39 is connected to the correction value generation circuit 38 via the signal line L16, and is connected to the comparator 23 via signal lines L17 and L18. The DA converter 39 receives the correction value of a digital value from the correction value generation circuit 38. The DA converter DA-converts the correction value to obtain a correction amount of an analog value. The DA converter 39 corrects the reference voltage on the P side according to the correction amount of the analog value, and supplies the corrected reference signal to a reference node 23c of the comparator 23 via the signal line L17. The DA converter 39 corrects the reference voltage on the N side according to the correction amount of the analog value, and supplies the corrected reference signal to a reference node 23d of the comparator 23 via the signal line L18.

Figure 3:
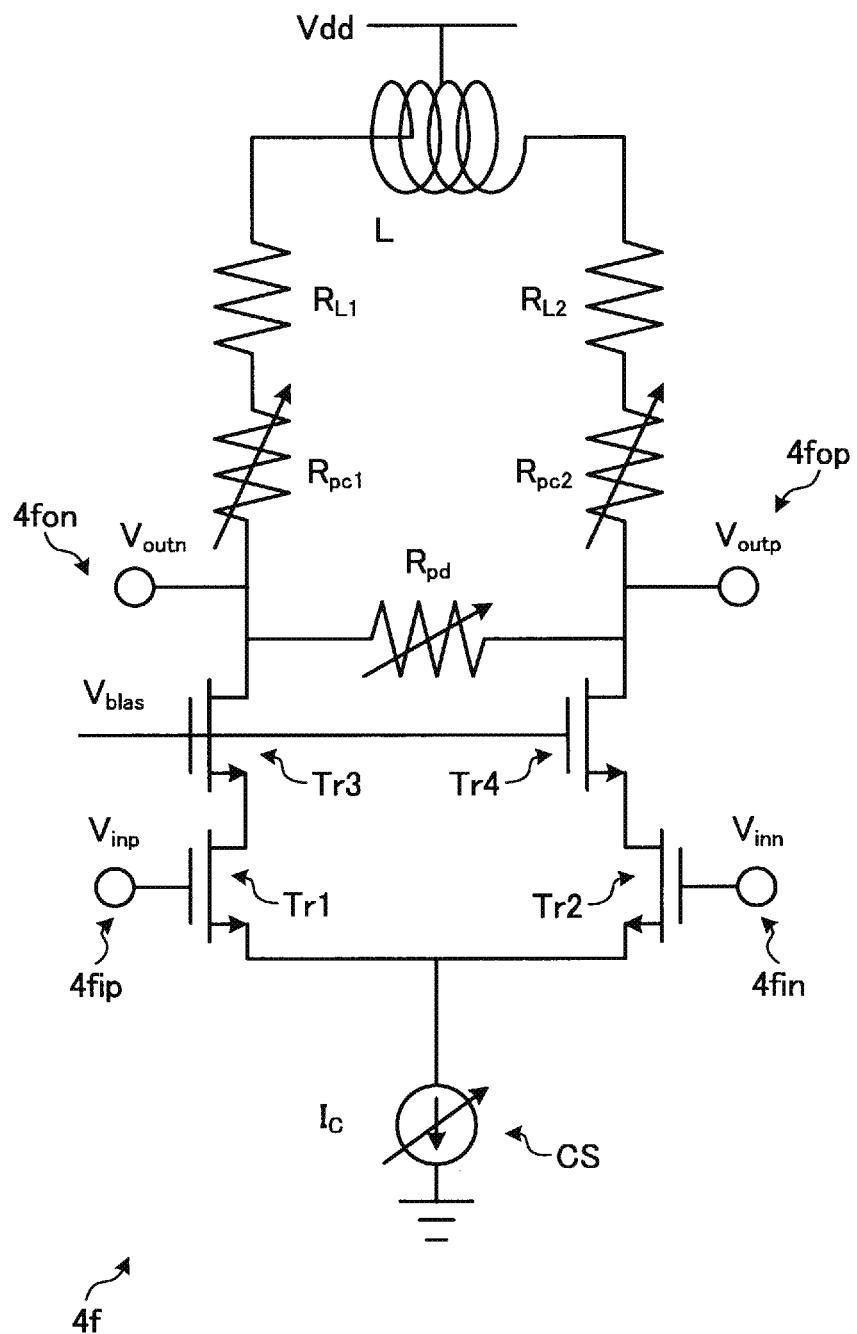
FIG. 3 is a circuit diagram illustrating a configuration of an amplifier circuit according to at least one embodiment.

Next, a configuration of the amplifier circuit 4f will be described with reference to FIG. 3. FIG. 3 is a diagram illustrating the configuration of the amplifier circuit 4f. The amplifier circuit 4f includes a current source CS, transistors Tr1 to Tr4, variable resistance elements $R_{pc1}$, $R_{pc2}$, and $R_{pd}$, resistance elements $R_{L1}$ and $R_{L2}$, and an inductor L.

The variable current source CS changes a current value $I_c$ according to a control code from the outside (for example, a controller). The variable current source CS includes a first end connected to a ground potential; and a second end connected to the transistors Tr1 and Tr2. The transistor Tr1 functions as an input transistor that receives an input voltage $V_{inp}$ on the P side at a gate. The transistor Tr1 may be, for example, an NMOS transistor, and includes a gate connected to an input terminal 4fip; a source connected to the current source CS; and a drain connected to the transistor Tr3. The transistor Tr2 functions as an input transistor that receives an input voltage $V_{inn}$ on the N side at a gate. The transistor Tr2 is, for example, an NMOS transistor, and includes a gate connected to an input terminal 4fin; a source connected to the current source CS; and a drain connected to the transistor Tr4. The transistor Tr3 is, for example, an NMOS transistor, and includes a gate connected to a bias voltage $V_{bias}$; a source connected to the transistor Tr1; and a drain connected to the output node 4fon and the variable resistance elements $R_{pc1}$ and $R_{pd}$. The transistor Tr4 may be, for example, an NMOS transistor, and includes a gate connected to the bias voltage $V_{bias}$; a source connected to the transistor Tr2; and a drain connected to the output node 4fop and the variable resistance elements $R_{pc1}$ and $R_{pd}$. The variable resistance element $R_{pc1}$ changes a resistance value according to a control code from the outside (for example, a controller). The variable resistance element $R_{pc1}$ includes a first end connected to the output node 4fon; and a second end connected to the resistance element $R_{L1}$. The variable resistance element $R_{pc2}$ changes a resistance value according to a control code from the outside (for example, a controller). The variable resistance element $R_{pc2}$ includes a first end connected to the output node 4fop; and a second end connected to the resistance element $R_{L2}$. The variable resistance element $R_{pd}$ changes a resistance value according to a control code from the outside (for example, a controller). The variable resistance element $R_{pd}$ includes a first end connected to the output node 4fon; and a second end connected to the output node 4fop. The resistance element $R_{L1}$ has a fixed resistance value, and includes a first end connected to the variable resistance element $R_{pc1}$; and a second end connected to the inductor L. The resistance element $R_{L2}$ has a fixed resistance value, and includes a first end connected to the variable resistance element $R_{pc2}$; and a second end connected to the inductor L. The variable resistance element $R_{pc1}$ and the resistance element $R_{L1}$ function as a load resistance of the transistor Tr3. The variable resistance element $R_{pc2}$ and the resistance element $R_{L2}$ function as a load resistance of the transistor Tr4. For example, a combined resistance value of the variable resistance element $R_{pc1}$ and the resistance element $R_{L1}$ in a low frequency band (approximately a DC level) and a combined resistance value of the variable resistance element $R_{pc2}$ and the resistance element $R_{L2}$ in a low frequency band (approximately a DC level) may be values $R_c$ approximately equal to each other.

The amplifier circuit 4f performs an amplification operation according to the input voltage $V_{inp}$ on the P side of the differential signal received from the input node 4fip and the input voltage $V_{inn}$ on the N side of the differential signal received from the input node 4fin. The amplifier circuit 4f outputs an output voltage $V_{outn}$ on the N side from the output node 4fon, and outputs an output voltage $V_{outp}$ on the P side from the output node 4fop. In response thereto, the generation circuit 31 generates a common mode voltage $V_{com}$ ($\approx V_{outp} + V_{outn})/2$).

Here, the amplifier circuit 4f may be configured so that a differential gain becomes constant, the common mode voltage $V_{com}$ depends on a value $I_c$ of a current flowing through the current source CS and a value $R_c$ of the load resistance, and common mode voltage $V_{com}$ is represented by the following Equation 1 when a value of the power supply voltage is defined as Vdd.

$$V_{com} = V\text{dd} - I_c \times R_c \qquad \text{Equation 1}$$

As represented in Equation 1, the common mode voltage $V_{com}$ has a mixture of the power supply voltage characteristic and the temperature characteristic.

Figure 4A:
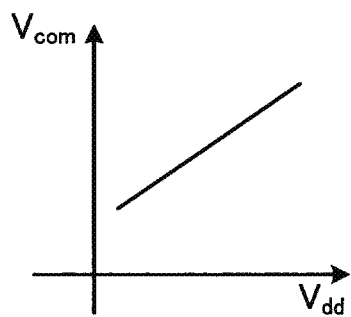
FIGS. 4A to 4D are diagrams illustrating power supply voltage characteristics and temperature characteristics according to at least one embodiment.
Figure 4B:
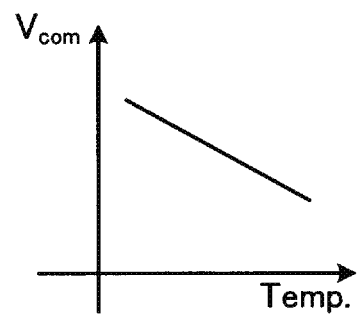
Figure 4C:
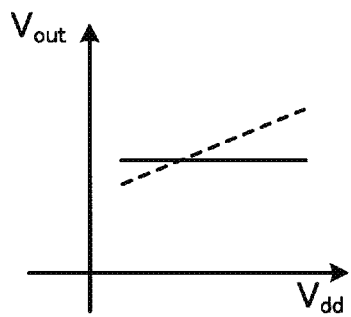
Figure 4D:
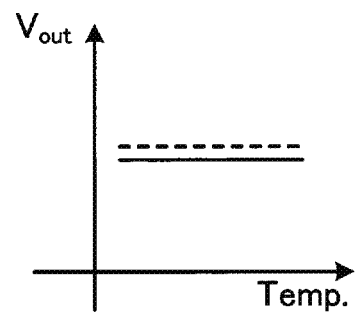

Here, a characteristic of the common mode voltage $V_{com}$ will be described with reference to FIGS. 4A to 4D. FIGS. 4A to 4D are diagrams illustrating the characteristic of the common mode voltage $V_{com}$. For example, when the current value $I_c$ and the resistance value $R_c$ are constant, as illustrated in FIG. 4A, the common mode voltage $V_{com}$ becomes an increasing function with respect to the power supply voltage Vdd, and can monotonically increase with respect to an increase in the power supply voltage Vdd. Since the current value $I_c$ of the variable current source CS increases in proportion to an absolute temperature, as illustrated in FIG. 4B, when the voltage value Vdd and the resistance value $R_c$ are constant, the common mode voltage $V_{com}$ becomes a decreasing function with respect to a temperature Temp, and can monotonically decrease with respect to an increase in the temperature Temp.

In order to understand the temperature characteristic of the amplifier circuit 4f, the temperature information may be acquired from a thermometer circuit outside the amplifier circuit 4f. However, the temperature characteristic of the amplifier circuit 4f is easily reflected and the accuracy is improved when the temperature characteristic of the amplifier circuit 4f is directly detected from a temperature change characteristic of the amplifier circuit 4f itself. In the semiconductor integrated circuit 1, the common mode voltage $V_{com}$ of the amplifier circuit 4f is used as the temperature change characteristic, and as described above, the common mode voltage $V_{com}$ has the mixture of the temperature characteristic and the power supply voltage characteristic.

Therefore, in order to understand the power supply voltage characteristic, each semiconductor integrated circuit 1 according to at least one embodiment includes a circuit configuration corresponding to a part of a circuit configuration of the amplifier circuit 4f, and uses a reference potential generator and a resistance type DA converter that operate by using the power supply voltage. An output $V_{out}$ of the reference potential generator has an almost constant characteristic with respect to a change in the power supply voltage as illustrated by a solid line in FIG. 4C, and has an almost constant characteristic with respect to a change in a temperature as illustrated by a solid line in FIG. 4D. On the other hand, an output $V_{out}$ of the resistance type DA converter has a characteristic of variation as an increasing function with respect to the change in the power supply voltage as illustrated by a dotted line in FIG. 4C and has an almost constant characteristic with respect to the change in the temperature as illustrated by a dotted line in FIG. 4D. That is, the semiconductor integrated circuit 1 uses a difference between the output of the reference potential generator and the output of the resistance type DA converter, thereby making it possible to obtain the voltage information indicating the power supply voltage characteristic.

In order to understand the temperature characteristic, the semiconductor integrated circuit 1 according to at least one embodiment uses the resistance type DA converter which is estimated to have almost the same temperature as that of the amplifier circuit 4f. The resistance type DA converter includes a circuit configuration corresponding to a part of the circuit configuration of the amplifier circuit 4f. The common mode voltage $V_{com}$ of the output of the amplifier circuit 4f (the differential signal) has a characteristic of variation as a decreasing function with respect to a change in a temperature as illustrated in FIG. 4B, and the output $V_{out}$ of the resistance type DA converter has an almost constant characteristic with respect to the change in the temperature, as illustrated by the dotted line in FIG. 4D. That is, the semiconductor integrated circuit 1 compares a difference between the common mode voltage $V_{com}$ of the output of the amplifier circuit 4f (the differential signal) and the output of the resistance type DA converter, and removes a component of the power supply voltage characteristic according to the voltage information. This makes it possible to obtain the temperature information indicating the temperature characteristic.

Figure 5:
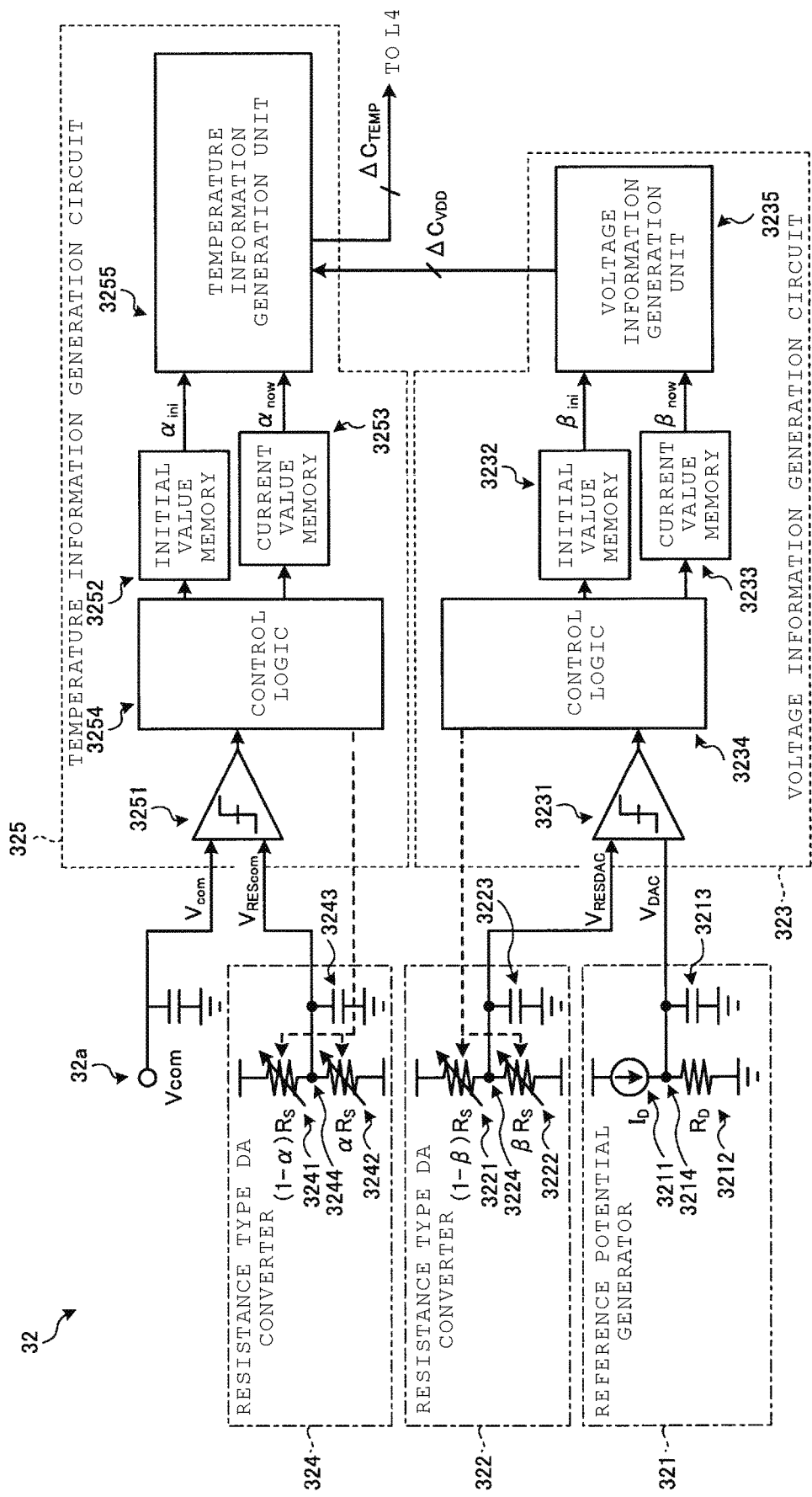
FIG. 5 is a circuit diagram illustrating a configuration of a generation circuit according to at least one embodiment.

For example, in the semiconductor integrated circuit 1, the generation circuit 32 may be configured as illustrated in FIG. 5. FIG. 5 is a circuit diagram illustrating a configuration of the generation circuit 32.

The generation circuit 32 includes a reference potential generator 321, a resistance type DA converter 322, a voltage information generation circuit 323, a resistance type DA converter 324, and a temperature information generation circuit 325.

The voltage information generation circuit 323 is electrically connected between the reference potential generator 321 and the resistance type DA converter 322, and the temperature information generation circuit 325 and the correction circuit 41. The temperature information generation circuit 325 is electrically connected between an input node 32a, the resistance type DA converter 324 and the voltage information generation circuit 323, and the correction circuit 41.

The reference potential generator 321 DA-converts a control code from the outside (for example, a controller) to generate a voltage $V_{DAC}$. The reference potential generator 321 includes a current source 3211, a resistance element 3212, and a capacitance element 3213. The current source 3211 includes a first end connected to a power supply potential; and a second end connected to an output node 3214. The current source 3211 flows a constant current $I_D$ that does not depend on the power supply voltage and the temperature according to the control code. The current source 3211 corresponds to the current source CS of the amplifier circuit 4f. The resistance element 3212 includes a first end connected to a ground potential and a second end connected to the output node 3214. The resistance element 3212 has a fixed resistance value $R_D$. The resistance element 3212 corresponds to the resistance elements $R_{L1}$ and $R_{L2}$ of the amplifier circuit 4f. The capacitance element 3213 includes a first end connected to a ground potential; and a second end connected to the output node 3214. The capacitance element 3213 has a fixed capacitance value.

The resistance type DA converter 322 DA-converts a control code from the voltage information generation circuit 323 to generate a voltage $V_{RESDAC}$. The resistance type DA converter 322 includes a variable resistance element 3221, a variable resistance element 3222, and a capacitance element 3223. The variable resistance element 3221 includes a first end connected to a power supply potential; and a second end connected to an output node 3224. The variable resistance element 3221 is adjusted to a resistance value $(1-\beta) R_S$ in accordance with the control code, and generates a voltage drop that depends on the power supply voltage and does not depend on the temperature. The variable resistance element 3222 includes a first end connected to a ground potential, and a second end connected to the output node 3224. The variable resistance element 3222 is adjusted to a resistance value $\beta R_S$ in accordance with the control code and generates the voltage drop that depends on the power supply voltage, and does not depend on the temperature. The variable resistance elements 3221 and 3222 correspond to the variable resistance elements $R_{pc1}$ and $R_{pc2}$ of the amplifier circuit 4f. The capacitance element 3223 includes a first end connected to a ground potential; and a second end connected to the output node 3224. The capacitance element 3223 has a fixed capacitance value.

The voltage information generation circuit 323 generates a first control code with respect to the resistance type DA converter 322 at a first timing according to an output voltage of the reference potential generator 321 and an output voltage of the resistance type DA converter 322. The voltage information generation circuit 323 generates a second control code with respect to the resistance type DA converter 322 at a second timing different from the first timing according to the output voltage of the reference potential generator 321 and the output voltage of the resistance type DA converter 322. The voltage information generation circuit 323 generates voltage information $\Delta C_{VDD}$ according to the first control code and the second control code. The voltage information generation circuit 323 outputs the voltage information $\Delta C_{VDD}$ to the temperature information generation circuit 325.

The voltage information generation circuit 323 includes a comparator 3231, an initial value memory 3232, a current value memory 3233, a control logic circuit 3234, and a voltage information generation unit 3235. The comparator 3231 is electrically connected between the reference potential generator 321 and the resistance type DA converter 322, and the control logic circuit 3234. The initial value memory 3232 and the current value memory 3233 are electrically connected between the control logic circuit 3234 and the voltage information generation unit 3235, respectively. The comparator 3231, the initial value memory 3232, the current value memory 3233, and the control logic circuit 3234 equivalently function as an AD converter. The control logic circuit 3234 is a circuit that realizes logic based upon a predetermined AD conversion method, and may be, for example, a logic circuit in accordance with a successive approximation register (SAR) type AD conversion method, a logic circuit in accordance with a tilt type AD conversion method, and a logic circuit in accordance with a follow-up type AD conversion method.

The comparator 3231 receives an analog voltage $V_{RESDAC}$ from the resistance type DA converter 322, and receives an analog voltage $V_{DAC}$ from the reference potential generator 321. The comparator 3231 compares the voltage $V_{RESDAC}$ and the voltage $V_{DAC}$ at the time of initial calibration, and outputs a comparison result to the control logic circuit 3234. The control logic circuit 3234 generates an initial value $\beta_{ini}$ of a coefficient in accordance with the comparison result and stores the generated initial value $\beta_{ini}$ in the initial value memory 3232. The control logic circuit 3234 generates a control code corresponding to a coefficient $\beta$ such that the voltage $V_{RESDAC}$ and the voltage $V_{DAC}$ are equal to each other according to the initial value $\beta_{ini}$ and feeds back the generated control code to the variable resistance elements 3221 and 3222 of the resistance type DA converter 322. During the operation, the comparator 3231 compares the voltage $V_{RESDAC}$ with the voltage $V_{DAC}$ again, and outputs a comparison result to the control logic circuit 3234. The control logic circuit 3234 generates a current value $\beta_{now}$ of a coefficient in accordance with the comparison result, and stores the generated current value $\beta_{now}$ in the current value memory 3233. The control logic circuit 3234 generates a control code corresponding to the coefficient $\beta$ such that the voltage $V_{RESDAC}$ and the voltage $V_{DAC}$ are equal to each other according to the current value $\beta_{now}$, and feeds back the generated control code to the variable resistance elements 3221 and 3222 of the resistance type DA converter 322. The voltage information generation unit 3235 generates the voltage information $\Delta C_{VDD}$ according to the initial value $\beta_{ini}$ and the current value $\beta_{now}$, and outputs the generated voltage information $\Delta C_{VDD}$ to the temperature information generation circuit 325.

For example, as illustrated in FIG. 6, the analog voltage $V_{RESDAC}$ from the resistance type DA converter 322 is represented by $\beta V_{DD}$ by using the coefficient $\beta$ indicating a ratio of two variable resistances. Since this analog voltage is in a real linear space, linear mapping is possible, and when this analog voltage is mapped to a digital code $C_{RESDAC}$ by $2^n/V_{DD}$, $\beta 2^n$ is obtained. The analog voltage $V_{DAC}$ from the reference potential generator 321 is represented by $R_D I_D$. Since this analog voltage is in the real linear space, linear mapping is possible, and when this analog voltage is mapped to a digital code $C_{DAC}$ by $2^n/V_{DD}$, $(2^n/V_{DD}) R_D I_D$ is obtained.

$\beta$ at the time of the initial calibration is defined as $\beta_{ini}$. At the time of the initial calibration, the control logic circuit 3234 operates with the power supply voltage $V_{DD} = V_{RESDAC}/\beta_{ini} = V_{DAC}/\beta_{ini}$. In the next operation, the control logic circuit 3234 changes $\beta$ so that $V_{RESDAC} = V_{DAC}$ is obtained, and $\beta$ at that time is defined as $\beta_{now}$. At this time, the power supply voltage characteristic as the variation of the power supply voltage becomes the following Equation 2.

$$\Delta V_{DD} = \Delta_{VRESDAC}/\beta_{now} = (\beta_{ini} V_{DD} - \beta_{now} V_{DD})/\beta_{now} \qquad \text{Equation 2}$$

When the power supply voltage characteristic $\Delta V_{DD}$ represented by Equation 2 is mapped to a digital code $\Delta C_{VDD}$ by $2^n/V_{DD}$, the following equation 3 is obtained.

$$\Delta C_{VDD} = 2^n\{(C_{\beta ini} - C_{\beta now})/C_{\beta now}\} \qquad \text{Equation 3}$$

In Equation 3, $C\beta_{ini}$ is a code in accordance with the initial value $\beta_{ini}$ of the coefficient, and $C_{\beta now}$ is a code in accordance with the current value $\beta_{now}$ of the coefficient. The digital code represented by Equation 3 is the voltage information $\Delta C_{vdd}$ generated by the voltage information generation unit 3235. A signal amount equal to or less than a minimum value (LSB) which can be generated by the DA converter can be generated as a quantization error in the digital code obtained by each equation. The digital code is a code that can also handle a negative value (for example, complement notation of 2).

The resistance type DA converter 324 DA-converts the control code from the temperature information generation circuit 325 to generate a voltage $V_{REScom}$. The resistance type DA converter 324 includes a variable resistance element 3241, a variable resistance element 3242, and a capacitance element 3243. The variable resistance element 3241 includes a first end connected to a power supply potential; and a second end connected to an output node 3244. The variable resistance element 3241 is adjusted to a resistance value $(1-\alpha) R_S$ in accordance with the control code, and generates a voltage drop that depends on the power supply voltage and does not depend on the temperature. The variable resistance element 3242 includes a first end connected to a ground potential; and a second end connected to the output node 3244. The variable resistance element 3242 is adjusted to a resistance value $\alpha R_S$ in accordance with the control code. The variable resistance element 3242 generates a voltage drop that depends on the power supply voltage and does not depend on the temperature. The variable resistance elements 3241 and 3242 correspond to the variable resistance elements $R_{pc1}$ and $R_{pc2}$ of the amplifier circuit 4f. The capacitance element 3243 includes a first end connected to a ground potential, and a second end connected to the output node 3244. The capacitance element 3243 has a fixed capacitance value.

The temperature information generation circuit 325 generates a third control code with respect to the resistance type DA converter 324 at a third timing according to a common mode voltage and an output voltage of the resistance type DA converter 324. The temperature information generation circuit 325 generates a fourth control code with respect to the resistance type DA converter 324 at a fourth timing different from the third timing according to the common mode voltage and the output voltage of the resistance type DA converter 324. The temperature information generation circuit 325 generates temperature information $\Delta C_{TEmP}$ according to the third control code, the fourth control code from the voltage information generation circuit 323, and the voltage information. The temperature information generation circuit 325 outputs the temperature information $\Delta C_{TEMP}$ to the correction circuit 41 via the line L4.

The temperature information generation circuit 325 includes a comparator 3251, an initial value memory 3252, a current value memory 3253, a control logic circuit 3254, and a temperature information generation unit 3255. The comparator 3251 is electrically connected between the input node 32a and the resistance type DA converter 324, and the control logic circuit 3254. The initial value memory 3252 and the current value memory 3253 are electrically connected between the control logic circuit 3254 and the temperature information generation unit 3255, respectively. The comparator 3251, the initial value memory 3252, the current value memory 3253, and the control logic circuit 3254 equivalently function as the AD converter. The control logic circuit 3254 is a circuit that realizes logic based upon the predetermined AD conversion method, and may be, for example, a logic circuit in accordance with the successive approximation register (SAR) type AD conversion method, the logic circuit in accordance with the tilt type AD conversion method, or the logic circuit in accordance with the follow-up type AD conversion method.

The comparator 3251 receives an analog voltage $V_{com}$ which is the common mode voltage from the amplifier circuit 4f via the generation circuit 31 and the input node 32a, and receives the analog voltage $V_{REScom}$ from the resistance type DA converter 324. The comparator 3251 compares the voltage $V_{REScom}$ with the voltage $V_{com}$ at the time of the initial calibration, and outputs a comparison result to the control logic circuit 3254. The control logic circuit 3254 generates an initial value $\alpha_{ini}$ of a coefficient in accordance with the comparison result, and stores the generated initial value $\alpha_{ini}$ in the initial value memory 3252. The control logic circuit 3254 generates a control code corresponding to a coefficient $\alpha$ such that the voltage $V_{REScom}$ and the voltage $V_{com}$ are equal to each other according to the initial value $\alpha_{ini}$. The control logic circuit 3254 feeds back the generated control code to the variable resistance elements 3241 and 3242 of the resistance type DA converter 324. During the operation, the comparator 3251 compares the voltage $V_{REScom}$ with the voltage $V_{com}$ again, and outputs a comparison result to the control logic circuit 3254. The control logic circuit 3254 generates a current value $\alpha_{now}$ of a coefficient in accordance with the comparison result, and stores the generated current value $\alpha_{now}$ in the current value memory 3253. The control logic circuit 3254 generates a control code corresponding to the coefficient $\alpha$ such that the voltage $V_{RESDAC}$ and the voltage $V_{DAC}$ are equal to each other according to the current value $\alpha_{now}$, and feeds back the generated control code to the variable resistance elements 3241 and 3242 of the resistance type DA converter 324. The temperature information generation unit 3255 generates the temperature information $\Delta C_{TEMP}$ according to the initial value $\alpha_{ini}$, the current value $\alpha_{now}$, and the voltage information $\Delta C_{VDD}$, thereby outputting the generated temperature information $\Delta C_{TEMP}$ to the correction circuit 41 via the line L4.

For example, as illustrated in FIG. 6, the analog voltage $V_{REScom}$ from the resistance type DA converter 324 is represented by $\alpha V_{DD}$ by using a coefficient $\alpha$ indicating a ratio of two variable resistances. Since this analog voltage is in a real linear space, linear mapping is possible, and when this analog voltage is mapped to a digital code $C_{REScom}$ by $2^n/V_{DD}$, $\alpha 2^n$ is obtained. The amplifier circuit 4f is equivalently shown by series connection of a resistance element $R_c$ and a current source $I_c$, and the common mode voltage $V_{com}$ can be regarded as a voltage outputted from a node between the resistance element $R_c$ and the current source $I_c$. The current source $I_c$ corresponds to the current source CS illustrated in FIG. 3, and the resistance element $R_c$ corresponds to the combined resistance of the respective elements connected between the current source CS and the power supply potential $V_{dd}$. When a temperature is defined as T, a proportional coefficient with respect to the temperature is defined as K, and $R_c I_c = KT$ is defined, the analog voltage $V_{com}$ from the amplifier circuit 4f is represented by $V_{DD} - KT$. Since this analog voltage is in the real linear space, linear mapping is possible, and when this analog voltage is mapped to a digital code $C_{com}$ by $2^n/V_{DD}$, $(1 - KT/V_{DD}) 2^n$ is obtained.

At the time of the initial calibration, $\alpha$ is defined as $\alpha_{ini}$, and the temperature is defined as $T_{ini}$. At the time of the initial calibration, each analog voltage is represented as Equations 4 and 5.

$$V_{com} = V_{DD} - KT_{ini} \qquad \text{Equation 4}$$

$$V_{REScom} = \alpha_{ini} V_{DD} \qquad \text{Equation 5}$$

Here, in the case of $V_{REScom} = V_{com}$, the temperature $T_{ini}$ is represented as Equation 6 by Equations 4 and 5.

$$T_{ini} = (1/K)(1 - \alpha_{ini}) V_{DD} \qquad \text{Equation 6}$$

At the time of the next operation, $\alpha$ is defined as $\alpha_{now}$, and the temperature is defined as $T_{now}$. At this time, each analog voltage is represented as Equations 7 and 8.

$$V_{com} = (V_{DD} + \Delta V_{DD}) - KT_{now} \qquad \text{Equation 7}$$

$$V_{REScom} = \alpha_{now}(V_{DD} + \Delta V_{DD}) \qquad \text{Equation 8}$$

Here, when a is changed so as to be $V_{REScom} = V_{com}$, the temperature $T_{now}$ is represented as Equation 9 by Equations 7 and 8.

$$T_{now} = (1-K)(1 - \alpha_{now})(V_{DD} + \Delta V_{DD}) \qquad \text{Equation 9}$$

By Equations 6 and 9, the temperature characteristic as the variation of the temperature becomes the following Equation 10.

$$\Delta T = T_{now} - T_{ini} = (1/K)\{(\alpha_{ini} - \alpha_{now}) V_{DD} + (1 - \alpha_{now}) \Delta V_{DD}\} \qquad \text{Equation 10.}$$

When the temperature characteristic $\Delta T$ represented by Equation 10 is mapped to a digital code $\Delta C_{TEMP}$ by $2^n/V_{DD}$ and $\{2^n/(V_{DD}K)\} = C_{(1/K)}$ is defined, Equation 11 is obtained.

$$\Delta C_{TEMP} = C_{(1/K)}\{(C_{\alpha ini} - C_{\alpha now}) 2^n + (2^n - C_{\alpha now}) \Delta C_{VDD}\} \qquad \text{Equation 11.}$$

In Equation 11, $C_{\alpha ini}$ is a code in accordance with the initial value $\alpha_{ini}$ of the coefficient, $C_{\alpha now}$ is a code in accordance with the current value $\alpha_{now}$ of the coefficient, and $\Delta C_{VDD}$ is the voltage information represented by Equation 3. The digital code represented by Equation 11 is the temperature information $\Delta C_{TEMP}$ generated by the temperature information generation unit 3255.

That is, as represented in Equation 11, the temperature information generation unit 3255 removes a component in accordance with the voltage information $\Delta C_{VDD}$ from a comparison result between the code $C_{\alpha ini}$ in accordance with the initial value $\alpha_{ini}$ of the coefficient and the code $C_{\alpha now}$ in accordance with the current value $\alpha_{now}$ of the coefficient, thereby generating the temperature information $\Delta C_{TEMP}$ and supplying the generated temperature information $\Delta C_{TEMP}$ to the correction circuit 41. According to the temperature information $\Delta C_{TEMP}$, the correction circuit 41 corrects the reference voltage on the P side and the reference voltage on the N side, which are threshold voltages for data value determination, so as to compensate for the influence caused by the temperature characteristic. When the correction circuit 41 recognizes that the temperature drops according to the temperature information, the correction circuit 41 increases an absolute value of each of the reference voltage on the P side and the reference voltage on the N side so as to compensate for the drop of the temperature. When the correction circuit 41 recognizes that the temperature rises according to the temperature information, the correction circuit 41 reduces the absolute value of each of the reference voltage on the P side and the reference voltage on the N side so as to compensate for the increase thereof.

Figure 7B:
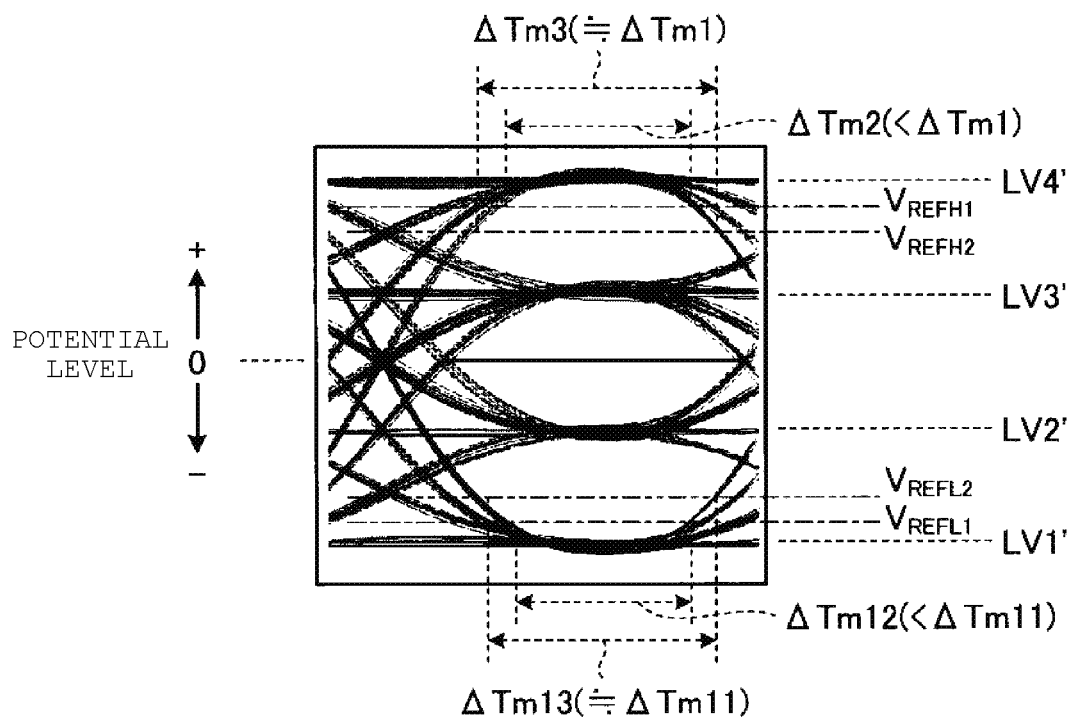

For example, a change in a time margin of the data value determination due to the temperature change is as shown in FIGS. 7A and 7B. FIG. 7A illustrates a time margin of the data value determination in a state where the temperature is T1, and FIG. 7B illustrates a time margin of the data value determination in a state where the temperature is T2 (>T1).

For example, in the case of the PAM4, a modulation signal has any of four signal levels LV1 to LV4 in FIG. 7A illustrating a waveform in the state where the temperature is T1. When a threshold voltage for signal level determination between the signal level LV3 and the signal level LV4 is set to $V_{REFH1}$ the time margin of the data value determination becomes $\Delta Tm1$. In FIG. 7B illustrating a waveform in the state of T2 in which the temperature is higher than T1, the modulation signal has any of four signal levels LV1' to LV4' whose amplitude levels are respectively attenuated. When a threshold voltage for the signal level determination between the signal level LV3' and the signal level LV4' is maintained at $V_{REFH1}$ the time margin of the data value determination is reduced to $\Delta Tm2$. Accordingly, erroneous determination of the data value is easy to increase, and a bit error rate can deteriorate.

On the other hand, the correction circuit 41 corrects the threshold voltage for the signal level determination between the signal level LV3' and the signal level LV4' from $V_{REFH1}$ to $V_{REFH2}$ so as to compensate for the temperature rise from T1 to T2. An absolute value of $V_{REFH2}$ is smaller than an absolute value of $V_{REFH1}$. Accordingly, the time margin of the data value determination can be achieved at $\Delta Tm3$ ($\approx \Delta Tm1$).

In the same manner, in FIG. 7A illustrating the waveform in the state where the temperature is T1, when a threshold voltage for the signal level determination between the signal level LV1 and the signal level LV2 is set to $V_{REFL1}$, the time margin of the data value determination becomes $\Delta Tm11$. In FIG. 7B illustrating the waveform in the state of T2 where the temperature is higher than T1, when a threshold voltage for the signal level determination between the signal level LV1' and the signal level LV2' is maintained at $V_{REFL1}$, the time margin of the data value determination is reduced to $\Delta Tm12$.

On the other hand, the correction circuit 42 corrects the threshold voltage for the signal level determination between the signal level LV1' and the signal level LV2' from $V_{REFL1}$ to $V_{REFL2}$ so as to compensate for the temperature rise from T1 to T2. An absolute value of $V_{REFL2}$ is smaller than an absolute value of $V_{REFL1}$. Accordingly, the time margin of the data value determination can be achieved at $\Delta Tm13$ ($\approx \Delta Tm11$).

As illustrated in FIGS. 7A and 7B, the correction performed by the correction circuits 41 and 42 can identify a value of a data signal by using an appropriate reference voltage in accordance with the temperature characteristic while the sequential operation is continued, and data can be appropriately restored.

As described above, in at least one embodiment, the semiconductor integrated circuit 1 compares the common mode voltage of the differential signal with the output of the DA converter, which is almost constant with respect to the temperature, generates the temperature information indicating the temperature characteristic, and corrects the threshold voltage for the data value determination according to the temperature information. Accordingly, it is possible to dynamically compensate for the influence caused by the temperature characteristic.

Figure 8:
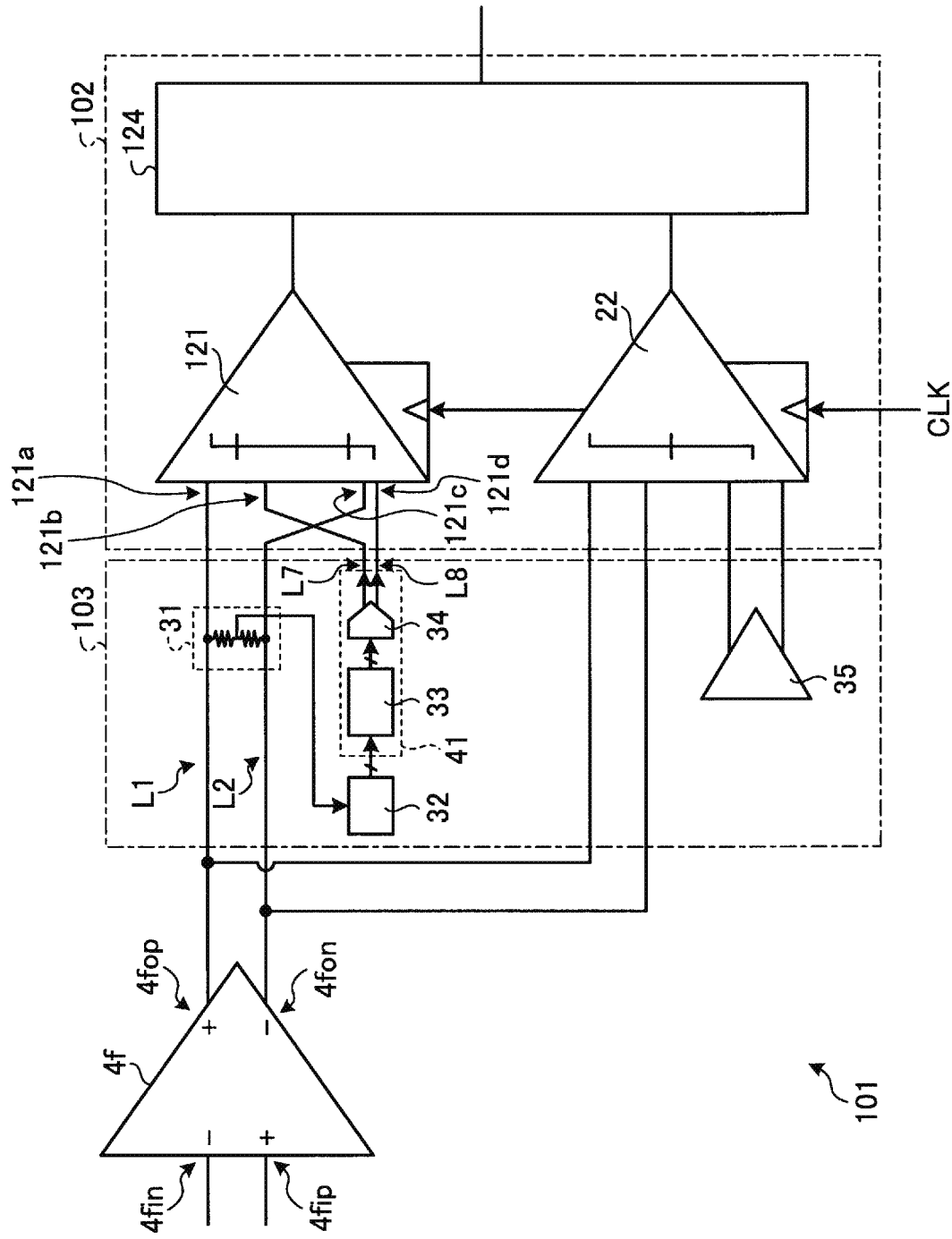
FIG. 8 is a circuit diagram illustrating a configuration of a semiconductor integrated circuit according to a first modification of at least one embodiment.

Even though the sampler includes two comparators that determine an amplitude absolute value and a polarity instead of the three comparators that determine the data value by using the threshold voltage on the high amplitude side, the central threshold voltage, and the threshold voltage on the low amplitude side, a concept of the at least one embodiment may be applied. For example, in a semiconductor integrated circuit 101, a sampler 102 may include a comparator 121 instead of the comparator 21 and the comparator 23 (refer to FIG. 2) as illustrated in FIG. 8. FIG. 8 is a circuit diagram illustrating a configuration of the semiconductor integrated circuit 101 according to a first modification of at least one embodiment. The connection configuration between the signal lines L2 and L7, and the comparator 121 is different from the connection configuration between the signal lines L2 and L7, and the comparator 21 in the at least one embodiment (refer to FIG. 2). The signal line L2 is a line for transmitting a differential signal on the N side, and is connected to an input node 121c for a reference signal on the P side of the comparator 121. The signal line L7 is a line for transmitting a reference voltage on the P side, and is connected to an input node 121b for a signal on the N side of the comparator 121. Accordingly, the comparator 121 functions as a comparator for determining the amplitude absolute value. The comparator 22 determines the data value by using the central threshold voltage in the same manner as that of the embodiment, and uses the determination result as a polarity determination result in the modification. That is, the comparator 22 functions as a polarity determination comparator.

In the configuration, a path from the generation circuit 31 to the comparator 121 via the generation circuit 32 and the correction circuit 41 is a path for correcting the threshold voltage for the amplitude absolute value determination according to a control value generated by a control circuit 103 and supplied to the generation circuit 32 and for supplying the corrected threshold voltage to the comparator 121. The generation circuit 31 generates the common mode voltage. The generation circuit 32 generates the voltage information, and generates the temperature information according to the voltage information and the common mode voltage. The generation circuit 32 supplies the temperature information to the correction circuit 41. The correction circuit 41 corrects the value of the reference voltage from a predetermined value according to the temperature information, and supplies the corrected reference voltage to the comparator 121.

A calculation circuit 124 restores the data value by using the amplitude absolute value determination result by the comparator 121, and the polarity determination result by the comparator 22. For example, in the case of (an amplitude absolute value determination value by the comparator 121, and a polarity determination value by the comparator 22)= (H, H) with respect to the data signal on the P side, the calculation circuit 124 restores the data value to "11" corresponding to the LV4. In the case of (the amplitude absolute value determination value by the comparator 121, and the polarity determination value by the comparator 22)=(L, H) with respect to the data signal on the P side, the calculation circuit 124 restores the data value to "10" corresponding to the LV3.

Even in the above-described configuration, it is possible not only to dynamically compensate for the influence of the temperature characteristic, but also to appropriately restore the data.

Figure 9:
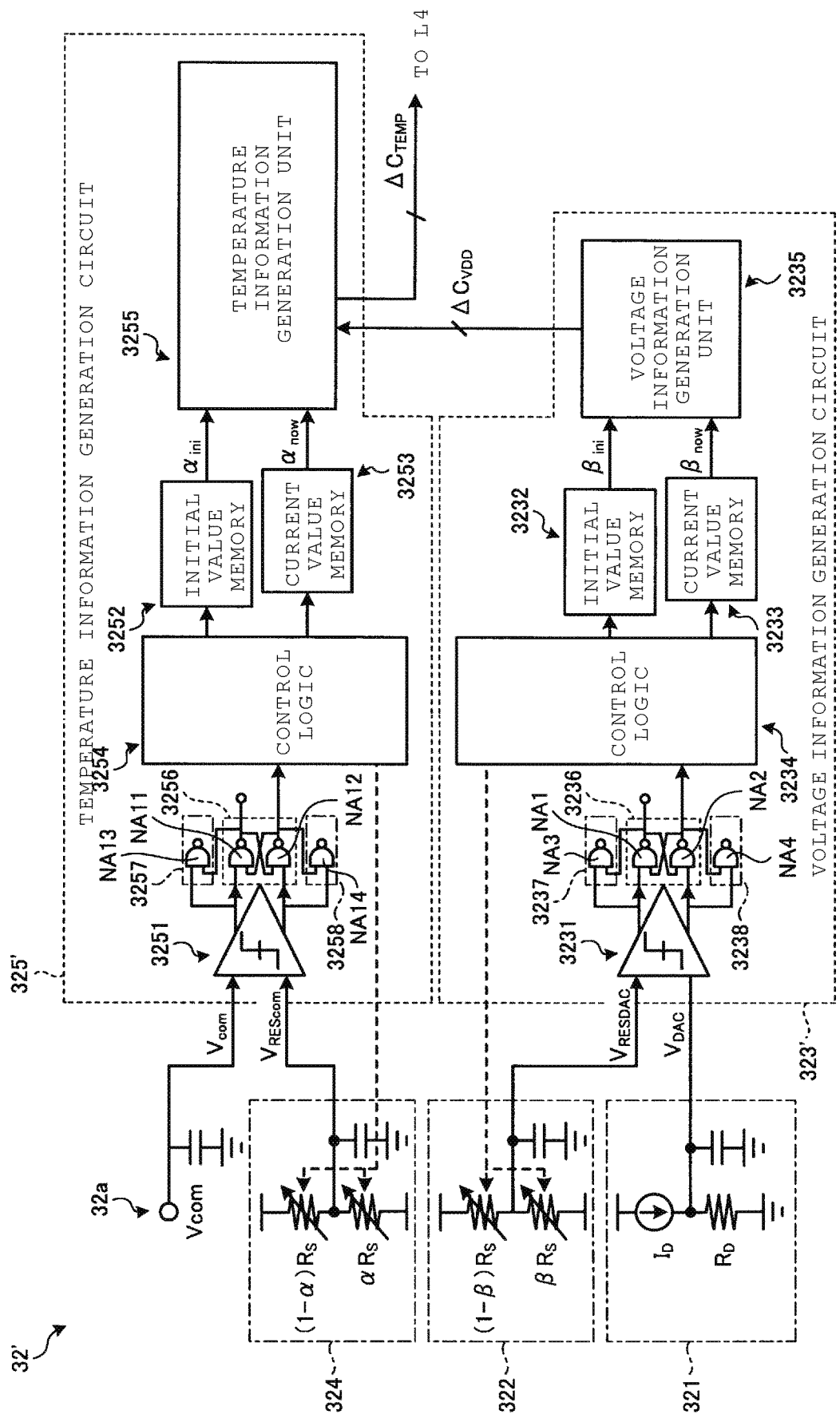
FIG. 9 is a circuit diagram illustrating a configuration of a generation circuit according to a second modification of at least one embodiment.

As illustrated in FIG. 9, a voltage information generation circuit 323' and a temperature information generation circuit 325' of a generation circuit 32' may have a configuration for preventing the offset of the comparators 3231 and 3251. FIG. 9 is a circuit diagram illustrating a configuration of the generation circuit 32' according to a second modification of the at least one embodiment.

Specifically, the voltage information generation circuit 323' includes a latch circuit 3236, an offset adjustment circuit 3237, and an offset adjustment circuit 3238.

The latch circuit 3236 includes two NAND gates NA1 and NA2. A first input node of the NAND gate NA1 is connected to an output node on the P side of the comparator 3231, and a second input node of the NAND gate NA1 is connected to an output node of the NAND gate NA2 and an output node on the N side of the latch circuit 3236. A first input node of the NAND gate NA2 is connected to an output node on the N side of the comparator 3231. A second input node of the NAND gate NA2 is connected to an output node of the NAND gate NA1 and an output node on the P side of the latch circuit 3236. Accordingly, the latch circuit 3236 latches a signal on the P side and a signal on the N side from the comparator 3231.

The offset adjustment circuit 3237 includes a NAND gate NA3. A first input node of the NAND gate NA3 is connected to the output node on the P side of the comparator 3231, and a second input node of the NAND gate NA3 is connected to the output node on the P side of the latch circuit 3236. Accordingly, the offset adjustment circuit 3237 can cancel the offset occurring between the input and output nodes on the P side of the latch circuit 3236 via a parasitic capacitance component.

The offset adjustment circuit 3238 incudes a NAND gate NA4. A first input node of the NAND gate NA4 is connected to the output node on the N side of the comparator 3231, and a second input node of the NAND gate NA4 is connected to the output node on the N side of the latch circuit 3236. Accordingly, the offset adjustment circuit 3238 can cancel the offset occurring between the input and output nodes on the N side of the latch circuit 3236 via the parasitic capacitance component.

In the same manner, the temperature information generation circuit 325' includes a latch circuit 3256, an offset adjustment circuit 3257, and an offset adjustment circuit 3258.

The latch circuit 3256 may include two NAND gates NA11 and NA12. A first input node of the NAND gate NA11 is connected to an output node on the P side of the comparator 3251, and a second input node of the NAND gate NA11 is connected to an output node of the NAND gate NA12 and an output node on the N side of the latch circuit 3256. A first input node of the NAND gate NA12 is connected to an output node on the N side of the comparator 3251, and a second input node of the NAND gate NA12 is connected to an output node of the NAND gate NA11 and an output node on the P side of the latch circuit 3256. Accordingly, the latch circuit 3256 latches a signal on the P side and a signal on the N side from the comparator 3251.

The offset adjustment circuit 3257 includes a NAND gate NA13. A first input node of the NAND gate NA13 is connected to an output node on the P side of the comparator 3251, and a second input node of the NAND gate NA13 is connected to an output node on the P side of the latch circuit 3256. Accordingly, the offset adjustment circuit 3257 can cancel the offset occurring between the input and output nodes on the P side of the latch circuit 3256 via the parasitic capacitance component.

The offset adjustment circuit 3258 includes a NAND gate NA14. A first input node of the NAND gate NA14 is connected to the output node on the N side of the comparator 3251, and a second input node of the NAND gate NA14 is connected to the output node on the N side of the latch circuit 3256. Accordingly, the offset adjustment circuit 3258 can cancel the offset occurring between the input and output nodes on the N side of the latch circuit 3256 via the parasitic capacitance component.

A concept of the at least one embodiment may be applied not only to the PAM4 but also to other multi-value amplitude modulation methods (for example, PAM8). Alternatively, the concept thereof may be applied not only to wired communication but also to an analog front end (AFE) of wireless communication.

While certain embodiments have been described, these embodiments have been presented by way of example only, and are not intended to limit the scope of the disclosure. Indeed, the novel embodiments described herein may be embodied in a variety of other forms; furthermore, various omissions, substitutions and changes in the form of the embodiments described herein may be made without departing from the spirit of the disclosure. The accompanying claims and their equivalents are intended to cover such forms or modifications as would fall within the scope and spirit of the disclosure.

What is claimed is:

1. A semiconductor integrated circuit, comprising:
    an amplifier circuit including a first output node and a second output node, the first output node arranged to output a first signal in a differential signal, the second output node arranged to output a second signal in the differential signal;
    a first generation circuit including a first end and a second end, the first end connected to the first output node of the amplifier circuit via a first signal line, the second end connected to the second output node of the amplifier circuit via a second signal line forming a differential pair with the first signal line, the first generation circuit configured to generate a common mode voltage of the differential signal;
    a second generation circuit configured to generate temperature information corresponding to a characteristic of the amplifier circuit related to an ambient temperature according to the common mode voltage;

a correction circuit configured to correct a first reference voltage and a second reference voltage according to the temperature information; and a comparator including a first input node to which the first signal line is electrically connected; a second input node to which the second signal line is electrically connected; a third input node to which the corrected first reference voltage is input; and a fourth input node to which the corrected second reference voltage is input.

2. The semiconductor integrated circuit according to claim 1, wherein the comparator is configured to function as a polarity determination comparator.

3. The semiconductor integrated circuit according to claim 1, wherein
the second generation circuit is configured to generate voltage information corresponding to a characteristic related to a power supply voltage of the amplifier circuit, and to generate the temperature information according to the common mode voltage and the generated voltage information.

4. The semiconductor integrated circuit according to claim 3, wherein
the second generation circuit includes:
a reference voltage generator;
a first DA converter; and
a voltage information generation circuit configured to:
generate a first control code with respect to the first DA converter at a first timing according to an output voltage of the reference voltage generator and an output voltage of the first DA converter,
generate a second control code with respect to the first DA converter at a second timing according to the output voltage of the reference voltage generator and the output voltage of the first DA converter, and
generate the voltage information according to the first control code and the second control code.

5. The semiconductor integrated circuit according to claim 4, wherein
the second generation circuit further includes:
a second DA converter; and
a temperature information generation circuit configured to:
generate a third control code with respect to the second DA converter at a third timing according to the common mode voltage and an output voltage of the second DA converter,
generate a fourth control code with respect to the second DA converter at a fourth timing according to the common mode voltage and the output voltage of the second DA converter, and
generate the temperature information according to the third control code, the fourth control code, and the voltage information.

6. The semiconductor integrated circuit according to claim 5, wherein the second timing is different from the first timing, and the fourth timing is different from the third timing.

7. The semiconductor integrated circuit according to claim 3, wherein
the second generation circuit further includes:
a DA converter; and
a temperature information generation circuit configured to:
generate a first control code with respect to the DA converter at a first timing according to the common mode voltage and an output voltage of the DA converter,
generate a second control code with respect to the DA converter at a second timing according to the common mode voltage and the output voltage of the DA converter, and
generate the temperature information according to the first control code, the second control code, and the voltage information.

8. A semiconductor integrated circuit, comprising:
a reference voltage generator;
a first DA converter;
a voltage information generation circuit configured to:
generate a first control code with respect to the first DA converter according to an output voltage of the reference voltage generator and an output voltage of the first DA converter obtained at a first timing,
generate a second control code with respect to the first DA converter according to the output voltage of the reference voltage generator and the output voltage of the first DA converter obtained at a second timing, and
generate voltage information corresponding to a characteristic related to a power supply voltage of an amplifier circuit according to the first control code and the second control code;
a second DA converter; and
a temperature information generation circuit configured to:
generate a third control code with respect to the second DA converter according to a common mode voltage of a differential signal outputted from the amplifier circuit and an output voltage of the second DA converter obtained at a third timing,
generate a fourth control code with respect to the second DA converter according to the common mode voltage and the output voltage of the second DA converter obtained at a fourth timing, and
generate temperature information corresponding to a characteristic of the amplifier circuit related to an ambient temperature according to the third control code, the fourth control code, and the voltage information.

9. A receiver, comprising:
a receiving node arranged to be connected to a wired transmission line; and
the semiconductor integrated circuit according to claim 1 which is disposed on the output side of the receiving node.

10. The receiver according to claim 9, wherein the comparator is configured to function as a polarity determination comparator.

11. The receiver according to claim 9, wherein
the second generation circuit is configured to generate voltage information corresponding to a characteristic related to a power supply voltage of the amplifier circuit, and to generate the temperature information according to the common mode voltage and the generated voltage information.

12. The receiver according to claim 11, wherein
the second generation circuit includes:
a reference voltage generator;
a first DA converter; and
a voltage information generation circuit configured to:

generate a first control code with respect to the first DA converter at a first timing according to an output voltage of the reference voltage generator and an output voltage of the first DA converter, generate a second control code with respect to the first DA converter at a second timing according to the output voltage of the reference voltage generator and the output voltage of the first DA converter, and generate the voltage information according to the first control code and the second control code.

13. The receiver according to claim 12, wherein the second generation circuit further includes:
a second DA converter; and
a temperature information generation circuit configured to:
generate a third control code with respect to the second DA converter at a third timing according to the common mode voltage and an output voltage of the second DA converter,
generate a fourth control code with respect to the second DA converter at a fourth timing according to the common mode voltage and the output voltage of the second DA converter, and
generate the temperature information according to the third control code, the fourth control code, and the voltage information.

14. The receiver according to claim 13, wherein the second timing is different from the first timing, and the fourth timing is different from the third timing.

15. The receiver according to claim 11, wherein the second generation circuit further includes:
a DA converter; and
a temperature information generation circuit configured to:
generate a first control code with respect to the DA converter at a first timing according to the common mode voltage and an output voltage of the DA converter,
generate a second control code with respect to the DA converter at a second timing according to the common mode voltage and the output voltage of the DA converter, and
generate the temperature information according to the first control code, the second control code, and the voltage information.

16. A receiver, comprising:
a receiving node arranged to be connected to a wired transmission line;
a semiconductor integrated circuit disposed on an output side of the receiving node,
wherein the semiconductor integrated circuit includes:
a reference voltage generator;
a first DA converter;
a voltage information generation circuit configured to:
generate a first control code with respect to the first DA converter according to an output voltage of the reference voltage generator and an output voltage of the first DA converter obtained at a first timing,
generate a second control code with respect to the first DA converter according to the output voltage of the reference voltage generator and the output voltage of the first DA converter obtained at a second timing, and
generate voltage information corresponding to a characteristic related to a power supply voltage of an amplifier circuit according to the first control code and the second control code;
a second DA converter; and
a temperature information generation circuit configured to:
generate a third control code with respect to the second DA converter according to a common mode voltage of a differential signal outputted from the amplifier circuit and an output voltage of the second DA converter obtained at a third timing,
generate a fourth control code with respect to the second DA converter according to the common mode voltage and the output voltage of the second DA converter obtained at a fourth timing, and
generate temperature information corresponding to a characteristic of the amplifier circuit related to an ambient temperature according to the third control code, the fourth control code, and the voltage information.

* * * * *